(12) United States Patent
Van Der Veen et al.

(10) Patent No.: US 12,211,543 B2
(45) Date of Patent: Jan. 28, 2025

(54) DYNAMIC ROWHAMMER MANAGEMENT

(71) Applicant: QUALCOMM INCORPORATED, San Diego, CA (US)

(72) Inventors: Victor Van Der Veen, Leusden (NL); Pankaj Deshmukh, San Diego, CA (US); Behnam Dashtipour, San Diego, CA (US); David Hartley, Berlin (DE)

(73) Assignee: QUALCOMM Incorporated, San Diego, CA (US)

( * ) Notice: Subject to any disclaimer, the term of this patent is extended or adjusted under 35 U.S.C. 154(b) by 178 days.

(21) Appl. No.: 17/940,430

(22) Filed: Sep. 8, 2022

(65) Prior Publication Data

US 2024/0087639 A1   Mar. 14, 2024

(51) Int. Cl.
| | | |
|---|---|---|
| G11C 11/4078 | (2006.01) | |
| G06F 13/16 | (2006.01) | |
| G11C 7/10 | (2006.01) | |
| G11C 11/406 | (2006.01) | |

(52) U.S. Cl.
CPC ...... *G11C 11/4078* (2013.01); *G06F 13/1636* (2013.01); *G06F 13/1668* (2013.01); *G11C 7/1063* (2013.01); *G11C 11/40611* (2013.01); *G11C 11/40618* (2013.01); *G11C 11/40622* (2013.01); *G11C 2211/4065* (2013.01)

(58) Field of Classification Search
CPC ........... G11C 11/4078; G11C 11/40611; G11C 11/40618; G11C 7/1063; G11C 2211/4065; G11C 11/40622; G06F 13/1636; G06F 13/1668
See application file for complete search history.

(56) References Cited

U.S. PATENT DOCUMENTS

| | | | | |
|---|---|---|---|---|
| 11,615,829 B1* | 3/2023 | Kim | ...................... | G11C 11/408 |
| | | | | 365/222 |
| 11,631,448 B1* | 4/2023 | Lee | .................. | G11C 11/40611 |
| | | | | 711/106 |
| 11,790,975 B2* | 10/2023 | Kim | .................. | G11C 11/40622 |
| | | | | 365/222 |
| 2019/0228813 A1* | 7/2019 | Nale | ...................... | G06F 3/0659 |
| 2022/0113868 A1* | 4/2022 | Cowles | ................. | G06F 3/0653 |
| 2022/0148648 A1* | 5/2022 | Chung | .................. | G11C 11/408 |
| 2022/0189532 A1 | 6/2022 | Nale et al. | | |
| 2022/0262428 A1* | 8/2022 | Bains | ................ | G11C 11/40622 |
| 2023/0047007 A1* | 2/2023 | Lovett | .............. | G11C 11/40615 |
| 2023/0315299 A1* | 10/2023 | Qureshi | ................ | G06F 3/0614 |

(Continued)

OTHER PUBLICATIONS

International Search Report and Written Opinion—PCT/US2023/028407—ISA/EPO—Oct. 13, 2023.

*Primary Examiner* — Hoai V Ho
*Assistant Examiner* — Justin Bryce Heisterkamp
(74) *Attorney, Agent, or Firm* — Smith Tempel Blaha LLC/Qualcomm

(57) ABSTRACT

Mitigating or managing an effect known as "rowhammer" upon a DRAM device may include a memory controller receiving an activation count threshold value from the DRAM device. The memory controller may detect row activation commands directed to the DRAM device and count the number of the row activation commands. The memory controller may send a mitigative refresh command to the DRAM device based on the result of comparing the counted number of row activation commands with the received activation count threshold value.

28 Claims, 9 Drawing Sheets

(56) References Cited

U.S. PATENT DOCUMENTS

2023/0385206 A1* 11/2023 Agarwal ............ G11C 11/40603
2023/0395118 A1* 12/2023 Vogelsang ......... G11C 11/40611
2023/0395120 A1* 12/2023 Ayyapureddi .... G11C 11/40622
2024/0079042 A1*  3/2024 Ahn .................. G11C 11/40611

* cited by examiner

DYNAMIC ROWHAMMER MANAGEMENT

DESCRIPTION OF THE RELATED ART

Dynamic random access memory ("DRAM") may be included in a wide variety of computing devices. Maintaining data integrity in DRAM is an important consideration.

It has been observed that repeatedly activating one or more rows of a DRAM array within a single refresh window may compromise data integrity, i.e., may result in corruption of stored data. Repeatedly activating one or more rows of a DRAM array may cause one or more cells of a physically adjacent row to leak its stored electrical charge, resulting in an increased probability of a bit flip. This phenomenon is commonly referred to as "row hammering" or "rowhammer," and may be exploited by an attacker to intentionally corrupt stored data.

A number of rowhammer mitigation methods have been developed. Some rowhammer mitigation methods may throttle or limit row activation rates when rapid row activations are detected. Other rowhammer mitigation methods may refresh potential victim rows when rapid row activations are detected. Rowhammer mitigation methods may count the number of row activations occurring within a refresh window. A threshold number of row activations, above which the probability of a bit flip is deemed unacceptably high, may be determined, and mitigation may be applied when the count of row activations reaches the threshold. It would be desirable to improve the mitigation or management of the rowhammer phenomenon.

SUMMARY OF THE DISCLOSURE

Systems, methods, and other examples are disclosed for mitigating or managing row hammering in a dynamic random access memory (DRAM) system.

An exemplary method may include receiving, by a memory controller, an activation count threshold value from a DRAM device. The exemplary method may also include detecting, by the memory controller, row activation commands directed to a bank of the DRAM device. The exemplary method may further include counting, by the memory controller, the number of the row activation commands. The exemplary method may still further include comparing, by the memory controller, the number of row activation commands with the activation count threshold value. The exemplary method may yet further include sending, by the memory controller, a mitigative refresh command to the DRAM device based on the result of comparing the number of row activation commands with the activation count threshold value.

An exemplary system may include interface logic, activation command detecting logic, activation command counting logic, comparing logic, and mitigative refresh logic. The interface logic may be configured to receive an activation count threshold value from a DRAM device. The activation command detecting logic may be configured to detect row activation commands directed to a bank of the DRAM device. The activation command counting logic may be configured to count the number of the row activation commands. The comparing logic may be configured to compare the number of row activation commands with the activation count threshold value. The mitigative refresh logic may be configured to send a mitigative refresh command to the DRAM device based on the result of comparing the number of row activation commands with the activation count threshold value.

Another exemplary system may include means for receiving an activation count threshold value from a DRAM device. The exemplary system may also include means for detecting row activation commands directed to a bank of the DRAM device. The exemplary system may further include means for counting the number of the row activation commands. The exemplary system may still further include means for comparing the number of row activation commands with the activation count threshold value. The exemplary system may yet further include means for sending a mitigative refresh command to the DRAM device based on the result of comparing the number of row activation commands with the activation count threshold value.

An exemplary memory controller may include command generating logic, interface logic, activation command detecting logic, activation command counting logic, comparing logic, and mitigative refresh logic. The command generating logic may be configured to generate DRAM commands, which may include row activation commands and refresh commands, in response to memory transaction requests. The interface logic may be configured to receive an activation count threshold value from a DRAM device. The activation command detecting logic may be configured to detect row activation commands directed to a bank of the DRAM device. The activation command counting logic may be configured to count the number of the row activation commands. The comparing logic may be configured to compare the number of row activation commands with the activation count threshold value. The mitigative refresh logic may be configured to send a mitigative refresh command to the DRAM device based on the result of comparing the number of row activation commands with the activation count threshold value.

An exemplary DRAM device may include at least one data storage array comprising a plurality of rows, per-row activation command counting logic, bucketizing logic, and bucket selecting logic. The per-row activation command counting logic may be configured to count the per-row number of the row activation commands directed to each row of the DRAM device. The bucketizing logic may be configured to determine the number of rows in each of a plurality of buckets, including, for each bucket, to count the number of rows having a per-row number of row activation commands directed thereto greater than or equal to a corresponding bucket activation count threshold of the bucket, wherein each bucket has a corresponding bucket activation count threshold different from all other buckets and a corresponding bucket threshold different from all other buckets. The bucket selecting logic may be configured to select, from among a subset of the buckets having non-zero numbers of rows therein, one of the buckets having the greatest bucket activation count threshold. The bucket selecting logic may further be configured to select the bucket threshold corresponding to the selected bucket and provide the selected bucket threshold to a memory controller.

BRIEF DESCRIPTION OF THE DRAWINGS

In the Figures, like reference numerals refer to like parts throughout the various views unless otherwise indicated. For reference numerals with letter character designations such as "101A" or "101B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects.

Figure 1:
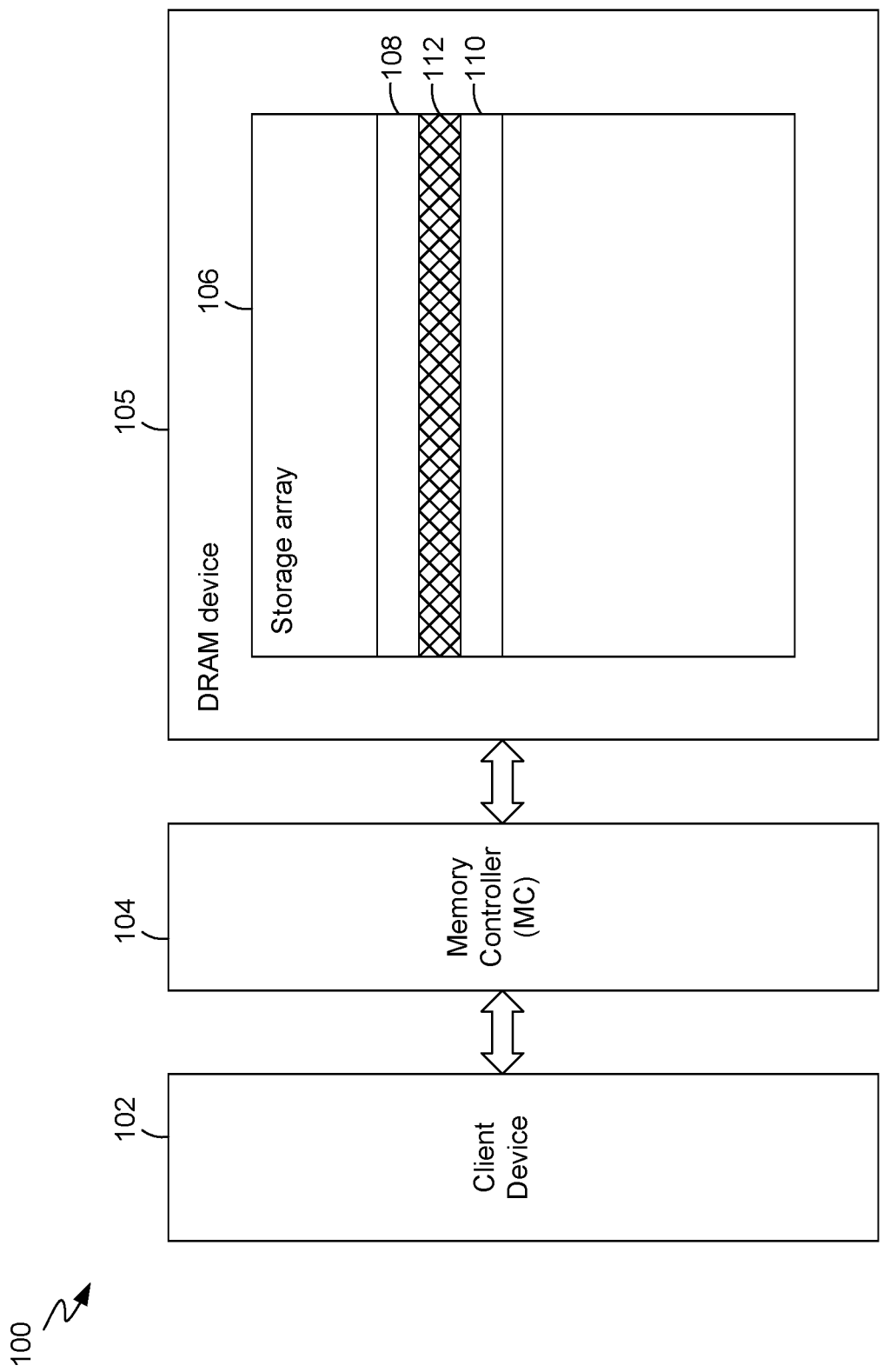
FIG. 1 is a block diagram of a DRAM system and a client device, in accordance with exemplary embodiments.

As shown in FIG. 1, in an illustrative or exemplary embodiment a system 100 may include a client device 102, a memory controller 104, and a dynamic random access memory ("DRAM") device 105 having one or more storage arrays 106. As described below, the memory controller 104 or, alternatively or in addition, the DRAM device 105, may include features for mitigating or managing the effects of the phenomenon commonly known as "rowhammer."

Rowhammer is a disturbance error that may result in corruption of data stored in the storage array 106. Repeatedly activating one or more rows 108, 110, etc., may cause the stored electrical charge in a cell (not individually shown in FIG. 1) of another row 112 that is physically proximate to those one or more rows 108, 110, etc., to leak that charge, increasing the probability of a bit flip. That is, as a result of a rowhammer attack, there may be an increased probability that a bit value read from a cell is different from the bit value that was originally stored in the cell. More specifically, a "1" that was stored before the rowhammer attack may be erroneously read as a "0" after the rowhammer attack, or a "0" that was stored before the rowhammer attack may be erroneously read as a "1" after the rowhammer attack. The rows 108, 110, etc., may be referred to as "aggressor" rows, and the row 112 (indicated in cross-hatch in FIG. 1 for emphasis) may be referred to as a "victim" row. In the illustrated example, the victim row 112 is immediately adjacent each of the aggressor rows 108 and 110. In other examples of rowhammer attacks, such a victim row may be adjacent to only one aggressor row. Although only three rows 108, 110 and 112 are shown for purposes of example, the storage array 106 may have any number of rows, such as, for example, 16 k, 32 k, etc., as understood by one of ordinary skill in the art.

Figure 2:
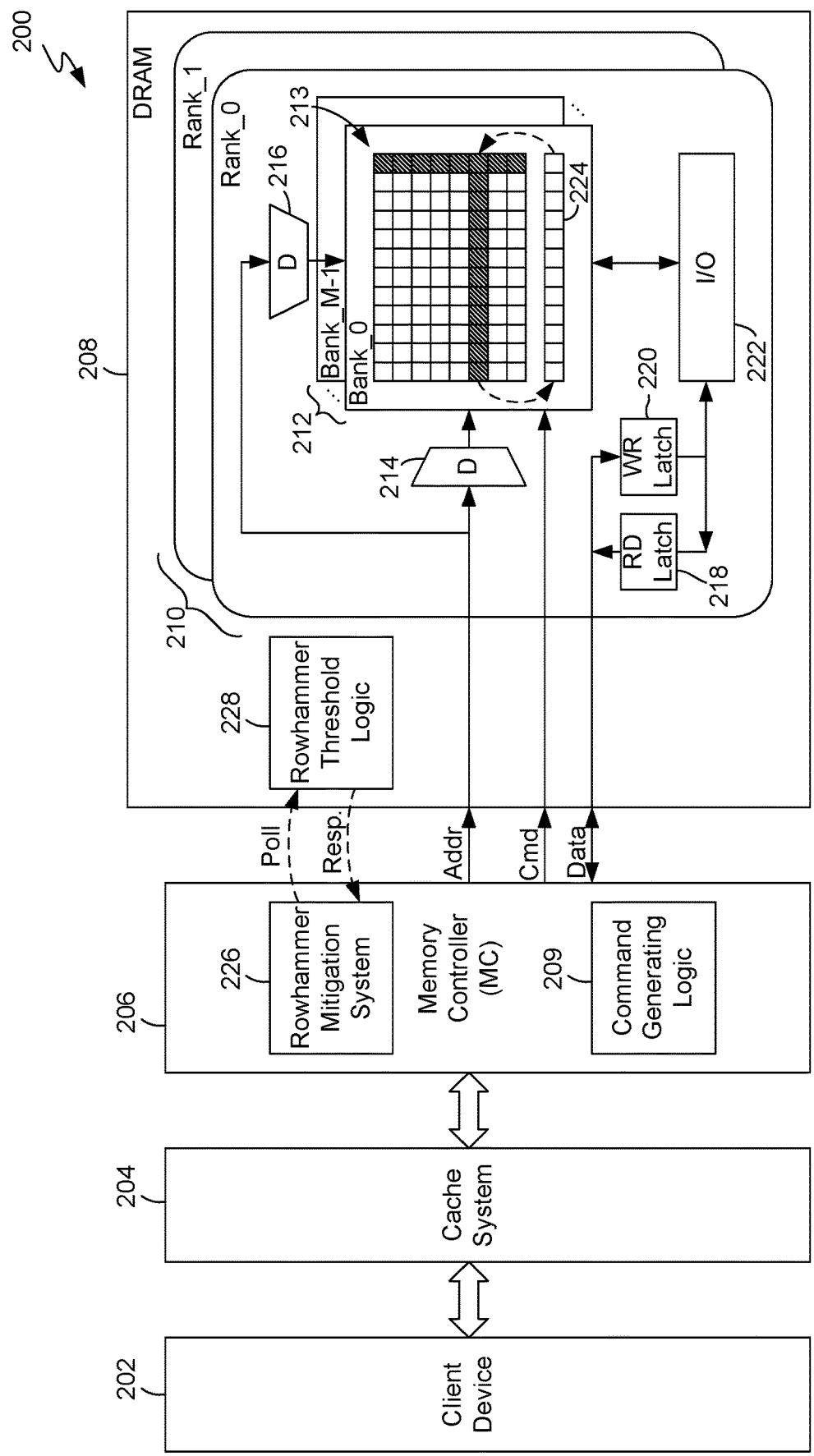
FIG. 2 is a block diagram similar to FIG. 1, showing memory controller and DRAM features for rowhammer mitigation, in accordance with exemplary embodiments.

As illustrated in FIG. 2, a system 200 may include a client device 202, a cache system 204, a memory controller 206, and a DRAM device 208. Some or all of these elements may be included in a "system-on-a-chip" or "SoC" that includes one or more types of processors, such as central processing units ("CPU"s), graphics processing units ("GPU"s), digital signal processors ("DSP"s), neural processing units ("NPU"s), etc. The client device 202 may, for example, be implemented in a CPU (not separately shown) or application processor. Although not shown in FIG. 2 for purposes of clarity, the system 200 may be included in a computing device, such as, for example, a portable computing device. The system 200 may be an example of the above-described system 100 (FIG. 1).

The client device 202 may issue DRAM transaction requests that may include read requests, i.e., requests to read data from the DRAM device 208, and write requests, i.e., requests to store data in the DRAM device 208. The DRAM transaction requests may also be referred to as requests to access the DRAM device 208. Each DRAM transaction request may include a target address in the DRAM device 208, a size or amount of data to be accessed, and other information. A write request also includes the data, which may be referred to as a payload, that the memory controller 206 is to store in the DRAM device 208 in response to the write request.

But for the features described herein with regard to rowhammer mitigation, the structure and operation of the memory controller 206 and DRAM device 208 are well understood by one of ordinary skill in the art. Nevertheless, the following brief description is provided as background.

The memory controller 206 may include command generating logic 209 configured to translate the transaction requests into DRAM commands ("Cmd") and physical DRAM addresses ("Addr") and provide the commands and addresses to the DRAM device 208. In addition to producing commands in response to transaction requests, the command generating logic 209 may produce periodic refresh commands. The memory controller 206 may queue the transaction requests and, using a scheduling algorithm, provide the associated commands and addresses to the DRAM device 208 in a determined order. In providing the commands and addresses to the DRAM device 208, the memory controller 206 may control the timing of such commands and addresses with respect to one another. As such aspects are well understood by one of ordinary skill in the art, they are not described in further detail herein. The memory controller 206 may include various other logic blocks or elements that are well understood by one of ordinary skill in the art, such as scheduling logic configured to perform the above-referenced scheduling, arbitration logic configured to control the order of the commands as they are conveyed through the memory controller 206 to the DRAM device 208, etc., and such elements are not shown in FIG. 2 for purposes of clarity.

The DRAM device 208 may be of any type not inconsistent with the descriptions herein. For example, the DRAM device 208 may be a double data rate synchronous DRAM ("DDR-SDRAM"), sometimes referred to for brevity as "DDR." As DDR technology has evolved, DDR versions such as fourth generation low-power DDR ("LPDDR4") and fifth generation low-power DDR ("LPDDR5") have been developed. The DRAM device 208 may comprise, for example, LPDDR4, LPDDR4X, LPDDR5, LPDDR5X, etc. Still other types of DDR include graphics DDR ("GDDR"). Although the DRAM device 208 may be DDR in the examples described herein, in other examples such a DRAM could be another type of low power DRAM, such as the SDRAM in a High Bandwidth Memory ("HBM").

The DRAM device 208 may comprise two ranks 210, which may be referred to as Rank_0 and Rank_1. Although two ranks 210 are shown in this example, in other examples there may be only one rank or more than two ranks. As the two ranks 210 are identical to each other, the following description applies to each rank 210. A rank 210 comprises two or more ("M") banks 212, which may be referred to as Bank_0 through Bank_M−1. Each bank 212 is organized as a two-dimensional storage array 213 of cells or storage locations, where the storage locations in the storage array 213 are accessed by selecting rows and columns. A cell's electrical charge represents a stored data value, i.e., a "1" or a "0". The storage array 213 may be an example of the storage array 106 shown in a more conceptual form in FIG. 1. The storage array 213 may have any number of rows, such as, for example, 16 k, 32 k, etc.

An exemplary row and an exemplary column of a storage array 213 are highlighted in cross-hatch in FIG. 2 for purposes of illustration. A row may also be referred to as a wordline in some examples. Also, although not illustrated in FIG. 2 for purposes of clarity, the DRAM device 208 may further be organized in bank groups. For example, each rank 210 may consist of four bank groups (not shown), and each of those bank groups may consist of four banks. In such an example the DRAM device 208 therefore consists of 32 distinct (i.e., individually addressable) banks 212. Although in the example illustrated in FIG. 2 the DRAM device 208 has two ranks 210, each having four bank groups, and each of the four bank groups has four banks 212, in other examples such a DRAM may be organized in any other way, including more or fewer ranks, banks, bank groups, etc., than in the illustrated example.

The physical addresses by which the memory controller 206 accesses the DRAM device 208 may include row addresses, column addresses, bank group addresses, and bank addresses. Also, although not shown for purposes of clarity, in response to a rank address (e.g., a chip select bit included in the read or write command) provided by the memory controller 206, rank address decoding logic may select one of the ranks 210. Although likewise not shown for purposes of clarity, in response to a bank address provided by the memory controller 206, bank address decoding logic may select one of the banks 212 in a selected bank group of a selected rank 210. In response to a row address provided by the memory controller 206, a row address decoder 214 may select one of the rows in a selected bank 212 of a selected bank group in a selected rank 210. Similarly, in response to a column address provided by the memory controller 206, a column address decoder 216 may select one of the columns in a selected bank 212 of a selected bank group in a selected rank 210. Sequential row addresses may correspond to sequential row physical locations. That is, a row having an address X+1 may be physically adjacent to a row having an address X, and a row having an address X−1 may similarly be physically adjacent to the row having the address X. In the example described above with regard to FIG. 1, the victim row 112 may have the address X, and the aggressor rows 108 and 110 may have the addresses X+1 and X−1. Sequential row addresses do not necessarily correspond to sequential row physical locations in all DRAMs, but such an example is shown in FIG. 1 to more clearly illustrate the rowhammer principle.

Each rank 210 may have a read latch 218 to buffer the read data, and a write latch 220 to buffer the write data. Each rank 210 may also have input/output ("I/O") logic 222 configured to direct the read and write data from and to selected memory locations.

Each bank 212 may have a row buffer 224. The row buffer 224 stores the contents of the selected row. A row must be selected or "opened" before it may be written to or read from. The DRAM device 208 opens a row, i.e., stores the contents of that row in the row buffer 224, in response to an activate ("ACT") command. Once a row is opened, the DRAM device 208 may read from or write to any number of columns in the row buffer 224 in response to read or write commands, also referred to as column address select ("CAS") commands. Following a read or write command, the data is transferred serially between the memory controller 206 and DRAM device 208 in units known as a "burst," which may be, for example, eight bits per data signal line. The row must be restored or "closed" after writing to or reading from the row buffer 224. The DRAM device 208 closes a row in response to a pre-charge ("PRE") command. Storage logic configured to act upon the storage arrays 213, latches 218 and 220, I/O logic 222, etc., in the manner described above in response to the row activation, refresh and other DRAM commands is also included in the DRAM device 208 but is not shown for purposes of clarity in FIG. 2.

In translating a read request or write request, the command generating logic 209 may determine commands needed to fulfill the request, and scheduling and arbitration logic (not shown) may determine a sequence and timing of the commands as they are sent from the memory controller 206 to the DRAM device 208. The command generating logic 209 may also generate refresh commands to perform periodic refresh operations to maintain data integrity. A command associated with such a periodic refresh operation may be referred to as a per-bank refresh ("REF" or "Ref") command. A per-bank refresh command is directed to a particular or selected bank (rather than all banks).

A "refresh window" refers to a fixed amount of time ("tREFW") within which all rows of a bank 212 must receive refresh operations to maintain data integrity. Within each refresh window, a fixed number of refresh operations, such as, for example, 8192 (i.e., 8 k) REF operations, must be performed to refresh all rows of the bank 212. That is, in such an example all rows in a bank 212 have been refreshed after 8192 REF operations have been performed. The refresh window may be referred to as a sliding window because while its length, tREFW, is fixed, the refresh window may occur at any time with respect to other DRAM-related signals.

As noted above, within each refresh window there may be a threshold number of activations of an aggressor row above which the probability of a bit flip in a victim row is deemed unacceptably high. This threshold number of activations may be determined empirically and may vary depending upon factors such as the physical distance between adjacent rows, semiconductor process variation, temperature, etc. Similarly, a Maximum Activation Count ("MAC_bank") of a given bank 212 may be determined. MAC_bank is a threshold number of same-bank same-row activations above which the probability of a bit flip in a victim row of that bank exceeds a threshold. The probability of a bit flip will not exceed this probability threshold so long as fewer than MAC_bank+1 same-row activations occur within the sliding refresh window (i.e., within tREFW). Stated conversely, the probability of a bit flip will exceed this threshold when an (MAC_bank+1)th same-row activation occurs within tREFW.

In addition to the above-described features of the system 200 that are well understood by one of ordinary skill in the art, rowhammer mitigation features may be included in the system 200. In accordance with one aspect of exemplary rowhammer mitigation features, the memory controller 206 may include a rowhammer mitigation system 226. In accordance with another aspect of exemplary rowhammer mitigation features, the DRAM device 208 may include rowhammer threshold logic 228. In accordance with one aspect of exemplary rowhammer mitigation systems and methods, the rowhammer mitigation system 226 of the memory controller 206 may receive from the rowhammer threshold logic 228 of the DRAM device 208 a per-bank activation count threshold value, referred to herein as R_Threshold. R_Threshold represents a current or dynamic estimate by the DRAM device 208 of the number of row activations above which the probability of a bit flip may exceed a probability threshold (though not necessarily the same probability threshold mentioned above). In accordance with another aspect of exemplary rowhammer mitigation systems and methods, the rowhammer mitigation system 226 may count the number of the row activation commands, and send an additional or mitigative refresh command to the DRAM device 208 when the counted number of row activation commands exceeds R_Threshold.

Broadly, the DRAM device 208 may determine R_Threshold in any manner. Nevertheless, exemplary methods by which the DRAM device 208 may determine or select R_Threshold may be described herein in accordance with other aspects of exemplary rowhammer mitigation systems and methods.

Figure 3:
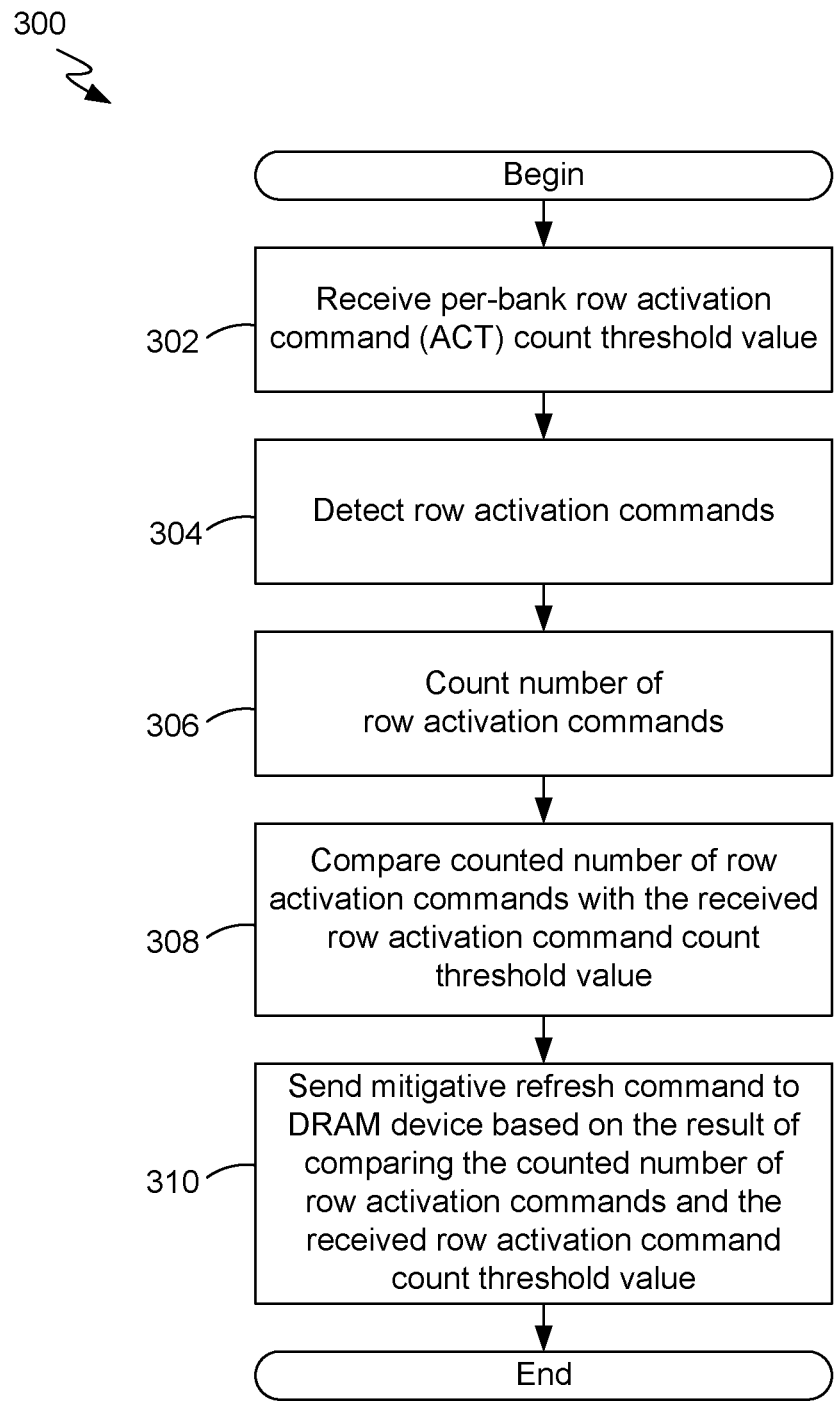
FIG. 3 is a flow diagram illustrating a method for rowhammer mitigation by a memory controller, in accordance with exemplary embodiments.

In FIG. 3 a method 300 is illustrated in flow diagram form. As indicated by block 302, the method 300 may include receiving, by a memory controller, an activation command count threshold value (R_Threshold) from a DRAM device. For example, the memory controller may receive the activation command count threshold value in response to polling the DRAM device. In some examples, the activation command count threshold value may be a per-bank activation command count threshold value. As noted above, "per-bank" refers to only one of the banks, as opposed to multiple banks collectively. It is contemplated that in some examples of the systems and methods described herein different (per-bank) activation command threshold values could be established for different banks.

As indicated by block 304, the method 300 may further include detecting, by the memory controller, the row activation commands. A row activation command may be a per-bank row activation command, i.e., directed to a row in a particular one of the banks. As indicated by block 306, the method 300 may also include counting, by the memory controller, the number of row activation commands. The counted number of row activations (which may also be referred to as the row activation command count) may be per-bank. That is, each time an activation command directed to any row in the bank is detected, the row activation command count for that bank may be incremented.

As indicated by block 308, the method 300 may still further include comparing, by the memory controller, the row activation command count with the received activation command count threshold value (R_Threshold) for the bank. As indicated by block 310, the method 300 may yet further include sending, by the memory controller, a mitigative refresh command to the DRAM device based on the result of comparing the row activation command count with the activation command count threshold value (R_Threshold). For example, the memory controller may send a mitigative refresh command to the DRAM device when the row activation command count is greater than R_Threshold. The aforementioned count of the number of row activation commands may be reset in response to the mitigative refresh command.

Figure 4:
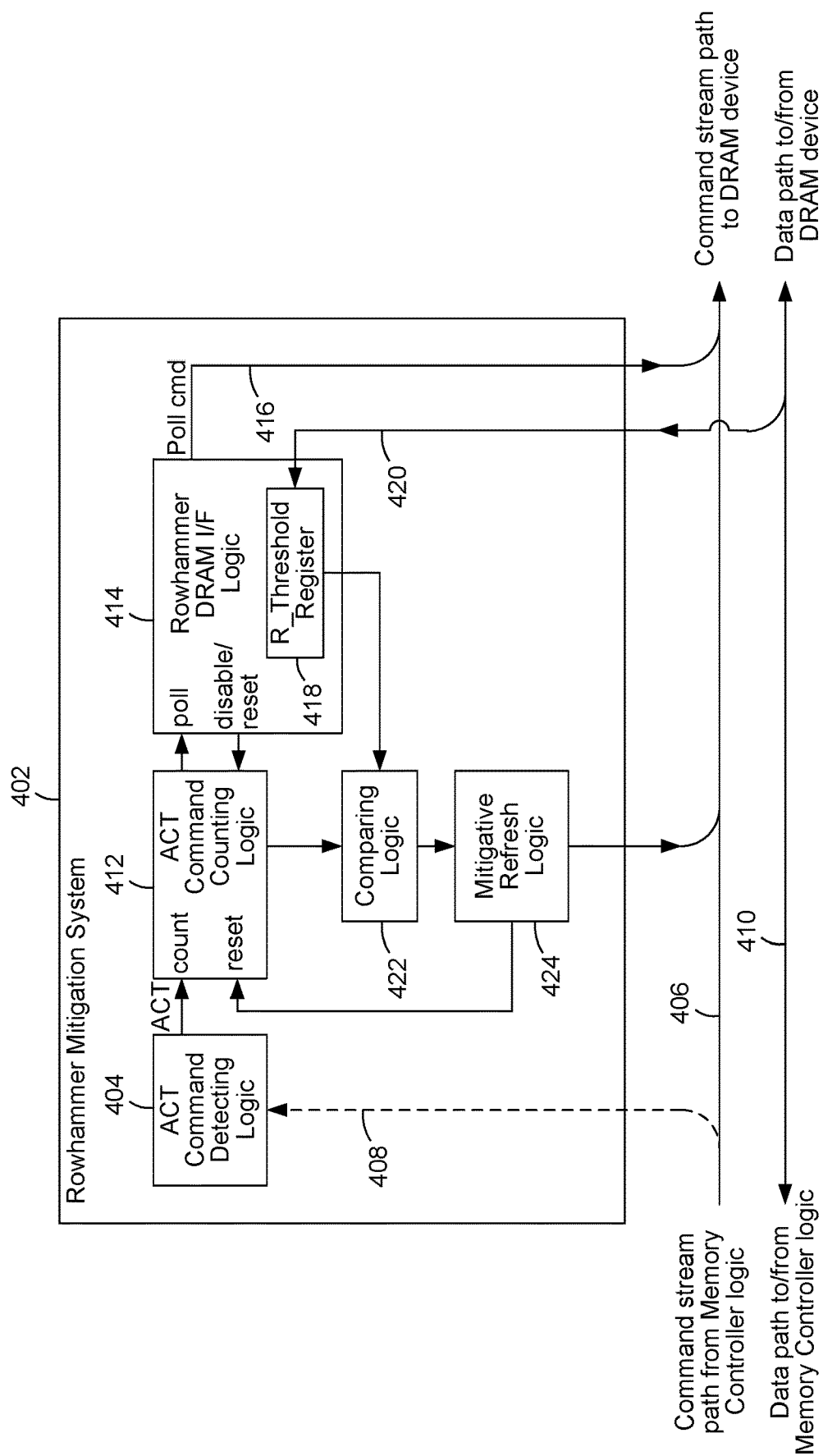
FIG. 4 is a block diagram illustrating a memory controller having a rowhammer mitigation system, in accordance with exemplary embodiments.

In FIG. 4 a rowhammer mitigation system 402 is illustrated in block diagram form. The rowhammer mitigation system 402 may be an example of the above-described rowhammer mitigation system 226 (FIG. 2).

The rowhammer mitigation system 402 may include activation command (ACT) detecting logic 404. The activation command detecting logic 404 may be configured to monitor a DRAM command stream path 406. The above-described commands, such as activation and refresh commands, may be conveyed along the command stream path 406 from the memory controller to the DRAM device (not shown in FIG. 4). As understood by one of ordinary skill in the art, the command stream path 406 may pass through any number of other components between the command generating logic 209 (FIG. 2) and the DRAM device (not shown in FIG. 4), but for purposes of clarity such other components are not shown, and the command stream path 406 is depicted in a conceptual manner. A monitoring path 408 through which the activation command detecting logic 404 may monitor the command stream path 406 is similarly conceptually depicted, in broken line to indicate that the activation command detecting logic 404 does not affect the command stream being sent to the DRAM device. The activation command detecting logic 404 may be configured to detect row activation commands. A portion of a data path 410 through which data may be communicated between the memory controller and the DRAM device is similarly shown.

The rowhammer mitigation system 402 may also include activation command counting logic 412. The activation command counting logic 412 may be configured to increment an activation command count each time the activation command detecting logic 404 provides an indication that it detected an activation command directed to any row in a bank. In some examples, the activation command counting logic 412 may be per-bank and maintain an activation command count for each bank.

The rowhammer mitigation system 402 may further include rowhammer DRAM interface logic 414. The rowhammer DRAM interface logic 414 may be configured to generate a poll command. The poll command may be generated periodically, i.e., at a poll interval. The poll interval may be an amount of time, and the rowhammer DRAM interface logic 414 may include a continuously operating timer (not separately shown) that triggers the poll command at the poll interval, such as every P milliseconds (where P is a number). Alternatively, the poll interval may be a number of command detections, such as activation command detections, and the rowhammer DRAM interface logic 414 may include another activation command counter (i.e., independent from the activation command counting logic 412) that triggers the poll command at the poll interval, such as every P activation commands. The poll command may be conveyed via a path 416 onto the command stream path 406. The rowhammer DRAM interface logic 414 may thus be configured to poll the DRAM device at such intervals. In some examples the value of P may be received from the DRAM device and may be adjusted dynamically, i.e., during operation of the memory system, by the DRAM device or the memory controller based on changes in operating conditions experienced by the DRAM device or the memory controller.

In response to the poll command, the DRAM device may send an activation command count threshold value (R_Threshold) to the memory controller. The rowhammer DRAM interface logic 414 may receive the activation command count threshold value and store it in an R_Threshold register 418. The activation command count threshold value (R_Threshold) may be received via a path 420 from the data stream path 410.

The rowhammer mitigation system 402 may include comparing logic 422 and mitigative refresh logic 424. The comparing logic 422 may be configured to receive the activation command count from the activation command counting logic 412 and to receive the value of R_Threshold from the R_Threshold register 418. The comparing logic 422 may be configured to compare the activation command count with the value of R_Threshold. The mitigative refresh logic 424 may be configured to send a mitigative refresh command to the DRAM device based on the result of that comparison. For example, the mitigative refresh logic 424 may be configured to send a mitigative refresh command ("RFM") to the DRAM device when the result of the comparison indicates the count has reached (i.e., has become equal to) the value of R_Threshold in the R_Threshold register 418. Nevertheless, in other examples such a mitigative refresh command may be sent before the count has reached R_Threshold.

The mitigative refresh logic 424 may be configured to provide an indication to the activation command counting logic 412 each time the mitigative refresh logic 424 sends a mitigative refresh command to the DRAM device. The activation command counting logic 412 may be configured to reset or initialize to zero the activation command count each time the activation command detecting logic 404 receives this indication from the mitigative refresh logic 424.

Figure 5:
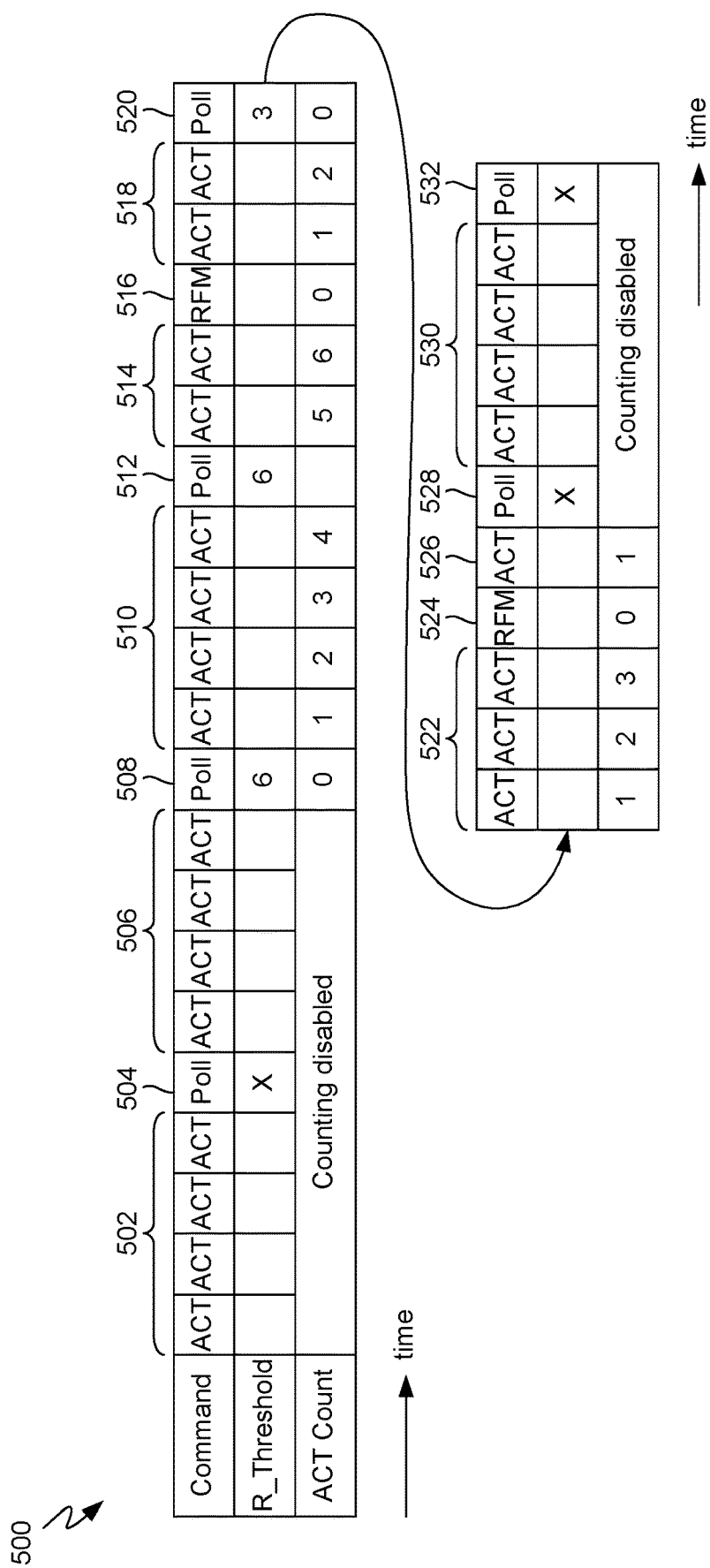
FIG. 5 illustrates an example of operation of a rowhammer mitigation system, in accordance with exemplary embodiments.

In FIG. 5 an example 500 of operation of the above-described rowhammer mitigation system 402 (FIG. 4) is illustrated. The example 500 illustrates a sequence of DRAM commands. Unless otherwise stated, a successive or next DRAM command in the example 500 may occur any amount of time after the preceding or previous DRAM command. Nevertheless, it may be appreciated that a rowhammer attack commonly comprises many activation commands occurring in rapid succession. The activation commands ("ACT") shown in FIG. 5 may represent detections by the above-described activation command detecting logic 404 (FIG. 4). The example 500 may also illustrate values of R_Threshold in relation to the commands. The example 500 may further illustrate, in relation to the commands, values of the activation command count ("ACT Count") maintained by the activation command counting logic 412 (FIG. 4). Periodic refresh commands are not shown in the example 500; rather, it may be understood that the illustrated DRAM commands may occur between two successive periodic refresh commands that are not shown for purposes of clarity.

The example 500 begins with four successive activation commands 502. In the example 500, successive activation commands are received at a fixed rate, and in accordance with this rate, four activation commands may be received during each poll interval. The number four is only an example, and in other examples, in which successive activation commands are received at a different fixed rate, or at varying rates, other numbers of activation commands may be received during the poll intervals. In the example 500, a first poll command 504 is generated following these four successive activation commands 502 (i.e., when a first poll interval elapses). The activation command counting logic 412 (FIG. 4) may count the activation commands and provide a poll indication every four activation commands to the rowhammer DRAM interface logic 414 (FIG. 4). In response to this poll indication, the rowhammer DRAM interface logic 414 may generate a poll command 504, which may be sent from the memory controller to the DRAM device as described above.

In response to the poll command 504 a value of R_Threshold may be received from the DRAM device and stored in the R_Threshold register 418 (FIG. 4). However, in the example 500, the value of R_Threshold received from the DRAM device in response to the poll command 504 is a unique identifier (indicated by "X"). The unique identifier does not represent a value of R_Threshold that the DRAM device has determined but instead represents the DRAM device's determination that no counting of activation commands is necessary at that time to mitigate a rowhammer attack. A response to a poll command thus may be either a valid value of R_Threshold or the unique identifier. The rowhammer DRAM interface logic 414 (FIG. 4) may be configured to detect the unique identifier (i.e., distinguish the unique identifier from a valid value of R_Threshold) and, in response, provide an indication to the activation command counting logic 412 to disable counting. In the example 500, counting remains disabled after receiving the response to the poll command 504.

The example 500 continues with another four successive activation commands 506. A second poll command 508 is then (i.e., when a second poll interval elapses) generated and sent to the DRAM device. In response to the poll command 508, a value of R_Threshold may be received from the DRAM device and stored in the R_Threshold register 418 (FIG. 4). In the example 500, the value of R_Threshold received from the DRAM device in response to the poll command 508 is 6. The value 6 is intended only as an example, and it should be understood that R_Threshold may be any value greater than zero. As a rowhammer attack may comprise many activation commands occurring in rapid succession, R_Threshold may be on the order of, for example, hundreds or thousands or more.

In response to receiving a valid value (i.e., not the unique identifier) of R_Threshold, the rowhammer DRAM interface logic 414 (FIG. 4) may enable the activation command counting logic 412. Upon being enabled, the activation command counting logic 412 may initialize its activation command count to zero, as shown in association with the poll command 508 in FIG. 5.

The example 500 continues with another four successive activation commands 510. Each time the activation command detecting logic 404 (FIG. 4) detects one of the activation commands 510, the activation command counting logic 412 (FIG. 4) increments its activation command count. A third poll command 512 is then (i.e., when a third poll interval elapses) generated and sent to the DRAM device. In response to the poll command 512, a value of R_Threshold may be received from the DRAM device and stored in the R_Threshold register 418 (FIG. 4). In the example 500, the value of R_Threshold received from the DRAM device in response to the poll command 512 is again 6. Note that each time the activation command counting logic 412 increments its activation command count, the comparing logic 422 compares the new (i.e., incremented) activation command count with the value of R_Threshold in the R_Threshold register 418, which is 6 at that time in the example 500. As the activation command count has not reached 6, the activation command counting logic 412 may continue to count in response to further activation commands. Following two further activation commands 514, the activation command count reaches 6 in the example 500.

In the example 500, the comparing logic 422 compares the new activation command count, which is 6 at that time, with the value of R_Threshold in the R_Threshold register 418, which is also 6 at that time. In response to the determination by the comparing logic 422 that the activation command count has reached R_Threshold, the comparing logic 422 provides a refresh indication to the mitigative refresh logic 424 (FIG. 4). In response to this refresh indication, the mitigative refresh logic 424 may generate a mitigative refresh ("RFM") command 516, which may be sent from the memory controller to the DRAM device as described above. The activation command detecting logic 404 may detect the mitigative refresh command 516 and, in response, reset the activation command counting logic 412.

In the example 500, upon being reset, the activation command counting logic 412 (FIG. 4) is prepared to begin counting. Following two further activation commands 518, the activation command count has reached 2. Also, following the two further activation commands 518 a fourth poll interval has elapsed, and therefore the activation command counting logic 412 provides an indication to poll the DRAM device. In response to this poll indication, the rowhammer DRAM interface logic 414 (FIG. 4) may generate a fourth poll command 520.

In response to the poll command 520 a value of R_Threshold may be received from the DRAM device and stored in the R_Threshold register 418 (FIG. 4). In the example 500, the value of R_Threshold received from the DRAM device in response to the poll command 520 is 3. The rowhammer DRAM interface logic 414 (FIG. 4) may be configured to provide an indication to the activation command counting logic 412 (FIG. 4) when the value of R_Threshold is updated, i.e., when the value of R_Threshold received from the DRAM device is different from the value of R_Threshold then stored in the R_Threshold register 418. In the example 500, because the value of R_Threshold received from the DRAM in response to the poll command 520 is 3 while the value of R_Threshold in the R_Threshold register 418 prior to the poll command 520 is 6, the rowhammer DRAM interface logic 414 may provide the aforementioned indication to the activation command counting logic 412. In response to this indication that the value of R_Threshold has been updated, the activation command counting logic 412 may reset or initialize the activation count to zero.

Following three further activation commands 522, the activation command count reaches 3, which matches (i.e., has reached) the updated value of R_Threshold. In response to the determination by the comparing logic 422 (FIG. 4) that the activation command count has reached R_Threshold, the mitigative refresh logic 424 (FIG. 4) generates a mitigative refresh command 524.

Following another activation command 526 a fifth poll interval has elapsed, and therefore the activation command counting logic 412 (FIG. 4) provides an indication to poll the DRAM device. In response to this poll indication, the rowhammer DRAM interface logic 414 (FIG. 4) may send a fifth poll command 528 to the DRAM device.

In the above-described example 500, when the value of R_Threshold is updated (i.e., when the value of R_Threshold newly received from the DRAM device is different from the previous value of R_Threshold then stored in the R_Threshold register 418) the comparing logic 422 immediately begins comparing the activation command count with the new value of R_Threshold instead of the previous value of R_Threshold. Alternatively to immediately updating the previous value of R_Threshold with the new value of R_Threshold in this manner, the previous value of R_Threshold may retained (i.e., not immediately updated). For example, the difference between the previous value of R_Threshold and the then-current activation command count may be determined and compared with the new value of R_Threshold. If the difference is not less than the new value of R_Threshold, then the previous value of R_Threshold may be immediately updated as in the example 500. However, if the difference is less than the new value of R_Threshold, then the previous value of R_Threshold may be retained, i.e., continue to be compared with the activation command count.

With reference to the example 500, the difference between the activation command count of 2 just before the poll command 520 may be subtracted from the previous R_Threshold value of 6, resulting in a difference of 4. Because this difference of 4 is not less than the new R_Threshold value of 3 (received in response to the Poll command 520), the previous value of R_Threshold is immediately updated. Nevertheless, in another example (not shown), if the difference is less than the new R_Threshold value, the previous value of R_Threshold would not be immediately updated.

In response to the poll command 528, the unique identifier is received from the DRAM device. In response to detecting the unique identifier, the rowhammer DRAM interface logic 414 (FIG. 4) provides an indication to the activation command counting logic 412 (FIG. 4) to disable counting. In the same manner as described above, after a sixth poll interval has elapsed, a sixth poll command 532 is sent to the DRAM device.

Figure 6:
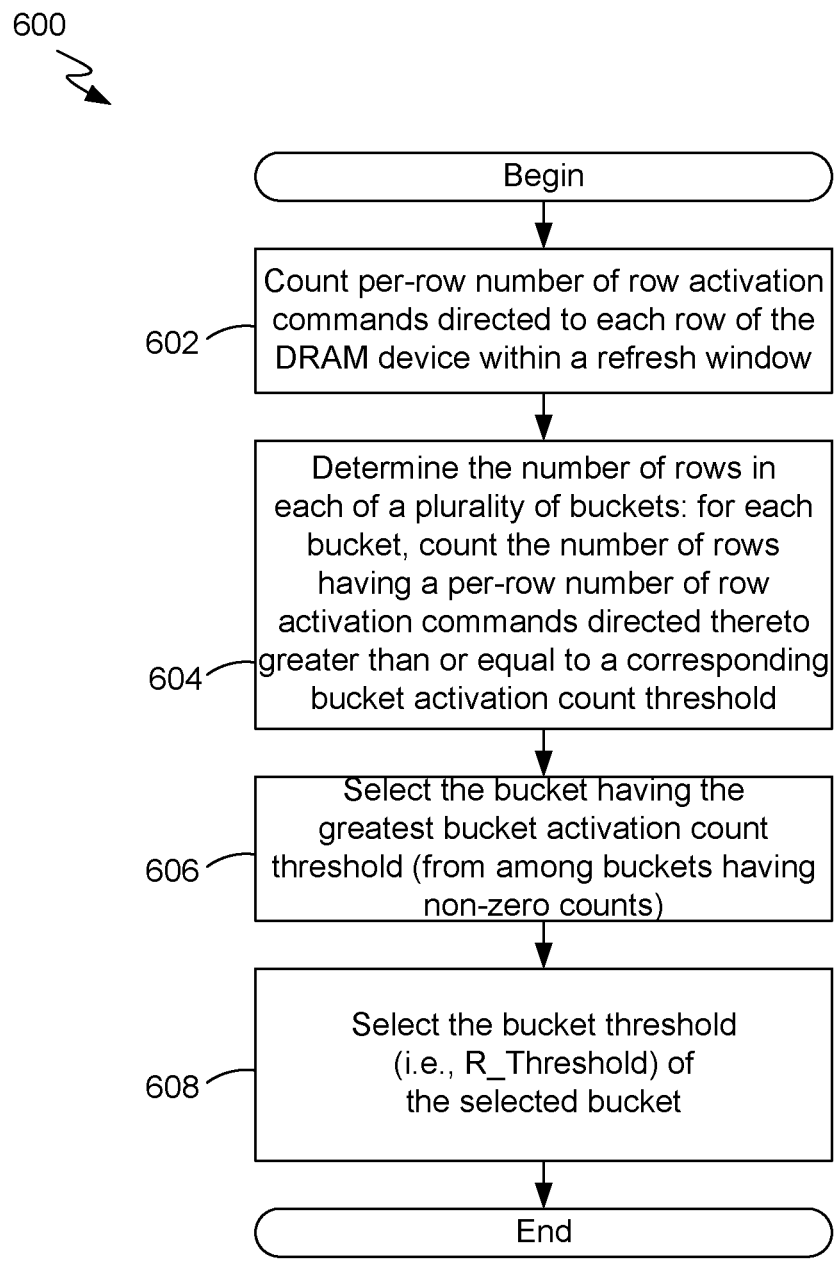
FIG. 6 is a flow diagram illustrating a method for determining a rowhammer activation count threshold by a DRAM device, in accordance with exemplary embodiments.

In FIG. 6, an exemplary method 600 by which a DRAM device may determine or select R_Threshold is illustrated in flow diagram form. As indicated by block 602, the method 600 may include counting, by the DRAM device, the number of per-row row activation commands directed to each row of the DRAM device.

As indicated by block 604, the method 600 may also include determining, by the DRAM device, the number of rows in each of a number of buckets. The term "buckets" is used herein for convenience to refer to a set of storage elements, such as data structures, counters, etc. This determining (block 604) may include, for each bucket, counting the number of rows having a per-row number of row activation commands directed thereto that is greater than or equal to the corresponding bucket activation count threshold of the bucket. In other words, there are a plurality of buckets or sets, and each bucket has a unique corresponding bucket activation count threshold (i.e., different from the bucket activation count thresholds of the other buckets). Each bucket may also have a unique corresponding bucket R_Threshold (i.e., different from the bucket R_Thresholds of the other buckets). The bucket R_Threshold may also be referred to for convenience as the "bucket threshold." Each bucket maintains a count of a number of rows. This row count may be incremented (conceptually, a row is "added to the bucket") when the number of row activation commands directed to that row is greater than or equal to the bucket activation count threshold of that bucket. An example of using such buckets is described below with regard to FIGS. 8A-8C.

As indicated by block 606, the method 600 may further include selecting, by the DRAM device, the bucket having the greatest bucket activation count threshold (from among a subset of the buckets containing non-zero numbers of rows). As indicated by block 608, the method 600 may still further include selecting, by the DRAM device, the bucket R_Threshold of the selected (block 606) bucket. The DRAM device may provide an indication of the selected bucket R_Threshold to the memory controller.

Figure 7:
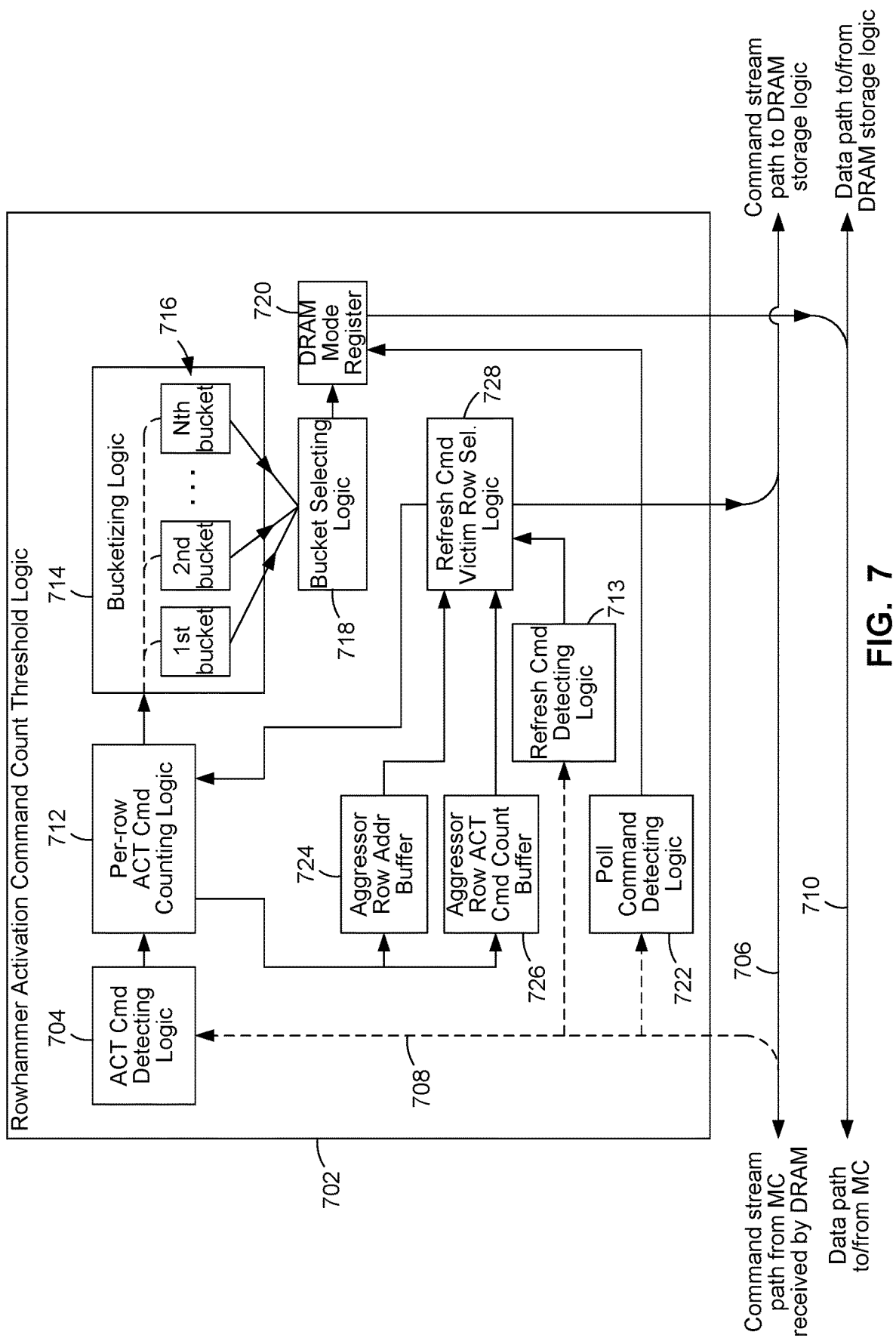
FIG. 7 is a block diagram illustrating rowhammer activation command count threshold logic, in accordance with exemplary embodiments.

In FIG. 7 rowhammer activation command count threshold logic 702 is illustrated in block diagram form. The rowhammer activation command count threshold logic 702 may be an example of the above-described rowhammer threshold logic 228 (FIG. 2).

The rowhammer activation command count threshold logic 702 may include activation command detecting logic 704. The activation command detecting logic 704 may be configured to monitor a DRAM command stream path 706 and to detect activation commands being conveyed via the command stream path 706 from the memory controller to the DRAM device's storage logic (not shown). A portion of a data path 710 through which data may be communicated to and from the DRAM device's storage arrays is also shown. The activation command detecting logic 704 may monitor the command stream path 706 through a monitoring path 708.

The rowhammer activation command count threshold logic 702 may also include per-row activation command counting logic 712. The per-row activation command counting logic 712 may be configured to maintain a separate activation command count for each row in each bank, and to increment a row's activation command count each time the activation command detecting logic 704 provides an indication that it detected an activation command directed to that row.

The rowhammer activation command count threshold logic 702 may further include bucketizing logic 714. The bucketizing logic 714 may include two or more data storage elements 716 or "buckets," each of which may comprise a data structure, a counter, etc. The bucketizing logic 714 is configured to maintain a row count in each of the data storage elements 716. The bucketizing logic 714 may receive from the activation command counting logic 712 a row's activation command count each time the activation command counting logic 712 increments that row's activation command count. Each bucket or data storage element 716 has associated with it a unique bucket activation command count threshold and a unique bucket R_Threshold. The bucketizing logic 714 may increment the row count of a bucket or data storage element 716 when the bucketizing logic 714 determines that a row's activation command count (as received from the activation command counting logic 712) has reached the bucket activation command count threshold associated with that bucket or data storage element 716. Conceptually, the bucketizing logic 714 adds that row to the bucket. Conceptually, as further rows reach bucket activation command count thresholds of that bucket, they are added to that bucket. Rows that reach bucket activation command count thresholds of other buckets are similarly added to those buckets. The row count of each bucket or data storage element 716 thus represents the number of rows having a number of row activation commands directed thereto that is greater than or equal to the bucket activation command count threshold of that bucket or data storage element 716.

The rowhammer activation command count threshold logic 702 may include bucket selecting logic 718. At any given time during operation, some of the buckets or data storage elements 716 may have zero row counts (if no rows have yet reached the associated bucket threshold). However, from among those buckets or data storage elements 716 having non-zero row counts, the bucket selecting logic 718 may be configured to select the bucket or data storage element 716 having the greatest associated bucket activation count threshold.

The bucket selecting logic 718 may be configured to store the bucket R_Threshold of the selected bucket in a DRAM mode register 720. As understood by one of ordinary skill in the art, the DRAM mode register 720 is a register in the DRAM device that a memory controller can access by sending the DRAM device a certain command. Such a command is referred to herein as a poll or polling command. The rowhammer activation command count threshold logic 702 (or in other examples, another portion of the DRAM device) may include poll command detection logic 722 configured to detect such a poll command. In response to detection of the poll command, the contents of the DRAM mode register 720 may be sent to the memory controller via the data path 710.

In the foregoing manner, the memory controller may receive the bucket R_Threshold of the selected bucket. The rowhammer mitigation system 402 (FIG. 4) may use the received bucket R_Threshold in the manner described above with regard to the activation command count threshold value (R_Threshold). Receiving the activation command count threshold value in this manner (i.e., in response to a poll command) may be an example of above-described block 302 of the method 300 (FIG. 3). As described above with regard to FIG. 4, receiving an activation command count threshold value in response to a poll command may occur at intervals. It may be appreciated that as the DRAM device may adjust the activation command count threshold dynamically, i.e., during operation of the memory system, the rowhammer mitigation systems and methods described herein may advantageously respond to changing operating conditions experienced by the DRAM device.

The rowhammer activation command count threshold logic 702 may further include an aggressor row address buffer 724, an aggressor row activation command count buffer 726, and refresh command row selecting logic 728. Together, the aggressor row address buffer 724 and the aggressor row activation command count buffer 726 may be configured to keep track of the rows experiencing the greatest activation, i.e., aggressor rows.

The aggressor row address buffer 724 and the aggressor row activation command count buffer 726 may receive activation command counts from the activation command counting logic 712. Each time the activation command counting logic 712 increments a row's activation command count, the activation command counting logic 712 may provide an indication identifying the row (e.g., a row number) to the aggressor row address buffer 724 and an indication of that row's (then-incremented) activation command count to the aggressor row activation command count buffer 726. The aggressor row activation command count buffer 726 may be configured to maintain or store a value indicating the greatest row activation command count. Each time the aggressor row activation command count buffer 726 receives a row's activation command count from the activation command counting logic 712, the aggressor row activation command count buffer 726 may compare that received activation command count with the stored value indicating the greatest row activation command count. If the received activation command count is greater than or equal to the stored value indicating the greatest row activation command count, then the aggressor row activation command count buffer 726 may replace the stored value indicating the greatest row activation command count with the received activation command count. The received activation command count thus becomes the stored (new) value indicating the greatest row activation command count. Also, each time the aggressor row activation command count buffer 726 replaces its stored value, the aggressor row address buffer 724 may store the associated indication (e.g., a row number) identifying the row. In this manner, the aggressor row address buffer 724 maintains or stores a value indicating the row determined to have the greatest row activation command count, while the aggressor row activation command count buffer 726 maintains or stores a value indicating the activation command count of that row.

The rowhammer activation command count threshold logic 702 may also include refresh command detecting logic 713 configured to monitor the command stream path 706 and to detect the above-described mitigative refresh commands being conveyed via the command stream path 706 from the memory controller to the DRAM device's storage logic (not shown). The refresh command detecting logic 713 may be configured to distinguish the mitigative refresh commands (RFM) from other (e.g., periodically scheduled or "REF") refresh commands and to provide an indication of the detection of a mitigative refresh command to the refresh command row selecting logic 728.

The refresh command row selecting logic 728 may be configured to select a victim row to which a detected mitigative refresh command is to be directed. When the refresh command row selecting logic 728 receives an indication of the detection of a mitigative refresh command, the refresh command row selecting logic 728 may obtain the value indicating the row determined to have the greatest row activation command count from the aggressor row address buffer 724. The row determined to have the greatest row activation command count at the time a mitigative refresh command is detected may be referred to as the aggressor row. The refresh command row selecting logic 728 may then determine which one or more rows may be physically adjacent to the aggressor row. The one or more rows determined to be physically adjacent to the aggressor row may be referred to as victim rows corresponding to that aggressor row. For example, if a row X is determined to have the greatest row activation command count, i.e., X is the aggressor row, the refresh command row selecting logic 728 may determine that rows X−1 and X+1 are the corresponding victim rows. The refresh command row selecting logic 728 may then direct the mitigative refresh command to those one or more corresponding victim rows.

The refresh command row selecting logic 728 may send an indication to the activation command counting logic 712 indicating that the refresh command row selecting logic 728 has directed a mitigative refresh command to one or more victim rows. In response to this indication, the activation command counting logic 712 may be configured to reset or initialize to zero the aggressor row's activation command count.

The refresh command detecting logic 713 may additionally be configured to detect refresh commands of types other than the mitigative refresh commands, such as periodically scheduled refresh commands, being conveyed via the command stream path 706 from the memory controller to the DRAM device's storage logic, and to provide an indication of such detection to the refresh command row selecting logic 728. The refresh command row selecting logic 728 may be configured to select a victim row to which such other type of detected mitigative refresh command is to be directed. The refresh command row selecting logic 728 may respond differently to detections of mitigative refresh commands and detections of other types of refresh commands. Additional buffers similar to the above-described buffers 724 and 726 may be provided to identify multiple victim rows, and the refresh command row selecting logic 728 may direct different numbers of refresh operations to different numbers of victim rows based on the type of refresh command detected. For example, in response to detection of a periodically scheduled refresh command the refresh command row selecting logic 728 may direct only a single refresh operation to a single victim row, while in response to detection of a mitigative refresh command the refresh command row selecting logic 728 may direct multiple refresh operations to multiple victim rows.

Figure 8A:
FIG. 8A is a table illustrating an initial state of operation of a rowhammer mitigation system, in accordance with exemplary embodiments.
Figure 8B:
FIG. 8B is a table illustrating a later state of operation of a rowhammer mitigation system, in accordance with exemplary embodiments.
Figure 8C:
FIG. 8C is a table illustrating a still later state of operation of a rowhammer mitigation system, in accordance with exemplary embodiments.

In FIGS. 8A, 8B and 8C, respective tables 802, 804 and 806 are shown that may be implemented as, for example, data structures. The tables 802-806 may be used by the bucketizing logic 714 and bucket selecting logic 718 (FIG. 7) as described above. The rows of the tables 802-806 represent the following data storage elements or "buckets": a non-usable or reference bucket having a bucket activation command count threshold of zero and a bucket R_Threshold that is not applicable ("N/A") or null; a first bucket having a bucket activation command count threshold of 100 and a bucket R_Threshold of 300; a second bucket having a bucket activation command count threshold of 250 and a bucket R_Threshold of 200; and a third bucket having a bucket activation command count threshold of 500 and a bucket R_Threshold of 100. Although in the tables 802-806 there are three usable buckets, in other examples there may be any number of buckets. Also, the bucket activation command count thresholds of 100, 250 and 500, and the bucket R_Thresholds of 300, 200 and 100 are intended only as examples, and may have any values. The following is an example of operation using the tables 802-806.

In FIG. 8A, the table 802 shows an initial state of operation in which the non-usable bucket has a row count of 65536, meaning that initially, all 65536 rows (e.g., all rows in an exemplary DRAM array) have had zero or more activation commands directed to each of them. The table 802 also shows that in that initial state of operation the first bucket has a row count of zero, meaning that initially, zero rows of the DRAM array have had 100 or more activation commands directed to each of them. The table 802 further shows that in the initial state of operation the second bucket has a row count of zero, meaning that initially, zero rows of the DRAM array have had 250 or more activation commands directed to each of them. The table 802 still further shows that in the initial state of operation the third bucket has a row count of zero, meaning that initially, zero rows of the DRAM array have had 500 or more activation commands directed to each of them. In this initial state of operation illustrated by the table 802, no bucket is selected because none of the usable buckets (i.e., the first, second or third buckets) has a non-zero row count. Accordingly, the unique identifier may be returned to the memory controller in response to a poll, as described above.

In FIG. 8B, the table 804 shows a later state of operation (i.e., later in time than the state shown in FIG. 8A) in which the non-usable bucket has a row count of 65536, meaning that all 65536 rows have had zero or more activation commands directed to each of them. The table 804 also shows that in this later state of operation the first bucket has a row count of 6224, meaning that 6224 rows of the DRAM array have had 100 or more activation commands directed to each of them. The table 804 further shows that in this later state of operation the second bucket has a row count of zero, meaning that zero rows of the DRAM array have had 250 or more activation commands directed to each of them. The table 804 still further shows that in this later state of operation the third bucket has a row count of zero, meaning that zero rows of the DRAM array have had 500 or more activation commands directed to each of them. In the state of operation illustrated by the table 804, the first bucket may be selected because, of all the buckets having non-zero row counts, the first bucket has the greatest bucket activation command count threshold (100). Accordingly, the bucket R_Threshold of 300 that is associated with the first bucket may be returned to the memory controller in response to a poll as described above.

In FIG. 8C, the table 806 shows a still later state of operation (i.e., later in time than the state shown in FIG. 8B) in which the non-usable bucket has a row count of 65536, meaning that all 65536 rows have had zero or more activation commands directed to each of them. The table 806 also shows that in this still later state of operation the first bucket has a row count of 6224, meaning that 6224 rows of the DRAM array have had 100 or more activation commands directed to each of them. The table 806 further shows that in this later state of operation the second bucket has a row count of 554, meaning that 554 rows of the DRAM array have had 250 or more activation commands directed to each of them. The table 806 still further shows that in this later state of operation the third bucket has a row count of 29, meaning that 29 rows of the DRAM array have had 500 or more activation commands directed to each of them. In the state of operation illustrated by the table 806, the third bucket may be selected because, of all the buckets having non-zero row counts, the third bucket has the greatest bucket activation command count threshold (500). Accordingly, the bucket R_Threshold of 100 that is associated with the third bucket may be returned to the memory controller in response to a poll as described above.

The systems and methods described above may reduce or mitigate the adverse effects of a rowhammer attack. Additional features may be included that adjust the responsiveness of the systems and methods to conditions indicative of a rowhammer attack. Such features may reduce "false positive" responses, in which the system or method is overly sensitive to conditions generally indicative of a rowhammer attack, or in which the system's or method's response is overly aggressive, potentially resulting in the introduction of a number of mitigative refreshes great enough to impact memory system performance.

A feature that may reduce false positive responses may vary or adjust the rate at which the memory controller polls the DRAM system. The memory controller may adjust the polling rate or interval in response to one or more operating conditions in the memory controller, such as, for example, an operating frequency of the memory controller, a measurement of memory bus activity, etc. A feature may also be included in which a new polling rate is provided by the DRAM device to the memory controller. For example, in response to being polled by the memory controller, the DRAM device may provide not only a new activation command count threshold value (R_Threshold) but also a new polling rate.

Another feature that may reduce false positive responses may be that in addition to the bucket selecting logic 714 selecting the bucket having the greatest bucket activation command count threshold from among the subset of buckets having non-zero row counts (i.e., "containing" more than zero rows), the bucket selecting logic 714 could select the bucket having the greatest bucket activation command count threshold from among the subset of buckets having row counts greater than or equal to an "activation count limit" or threshold L (i.e., "containing" more than L rows), where L is greater than zero. For example, with reference to FIGS. 8A-8C, the first bucket may have an activation count limit L of 5, the second bucket may have an activation count limit L of 3, and the third bucket may have an activation count limit L of 3. In such an example the bucket selecting logic 714 may not select the first bucket unless the first bucket's row count is greater than or equal to 5, may not select the second bucket unless the second bucket's row count is greater than or equal to 3, and may not select the third bucket unless the third bucket's row count is greater than or equal to 3.

Figure 9:
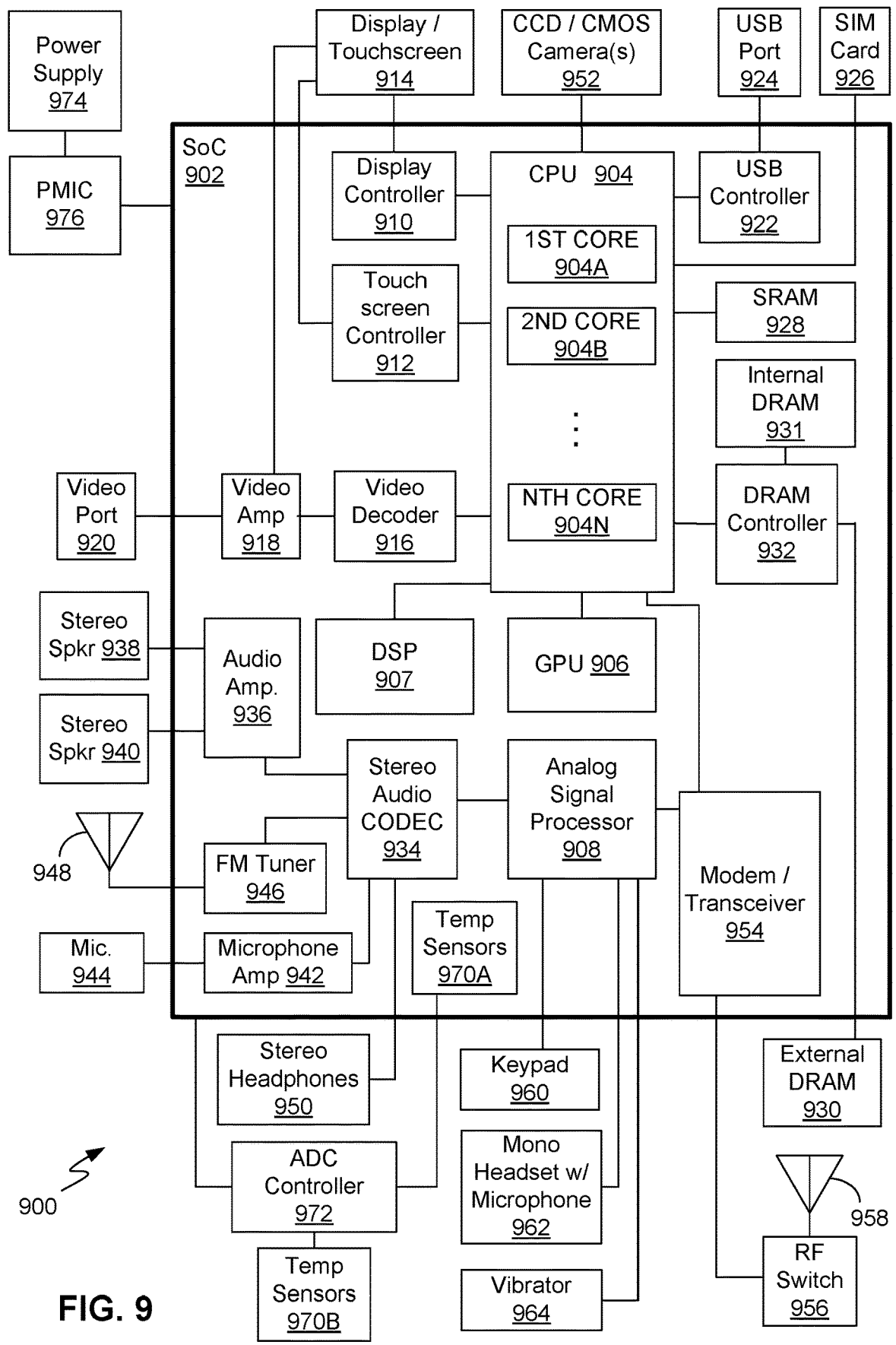
FIG. 9 is block diagram of a portable computing device, in accordance with exemplary embodiments.

FIG. 9 illustrates an example of a portable computing device ("PCD") 900, in which exemplary embodiments of systems, methods and other examples of rowhammer mitigation solutions may be provided. The PCD 900 may be, for example, a laptop or palmtop computer, cellular telephone or smartphone, personal digital assistant, navigation device, smartbook, portable game console, satellite telephone, etc. For purposes of clarity, some data buses, interconnects, signals, etc., are not shown in FIG. 9. The PCD 900 is only one example of a computing device in which the rowhammer mitigation solutions may be provided. The rowhammer mitigation solutions may be provided in any type of computing device having a DRAM memory system, such as a desktop computer, workstation, datacenter computing system, Internet of Things device, etc.

The PCD 900 may include an SoC 902. The SoC 902 may include a central processing unit ("CPU") 904, a graphics processing unit ("GPU") 906, a digital signal processor ("DSP") 907, an analog signal processor 908, a modem/modem subsystem 954, or other processors. The CPU 904 may include one or more CPU cores, such as a first CPU core 904A, a second CPU core 904B, etc., through an Nth CPU core 904N. The CPU 904 or a portion thereof may be an example of the above-described client device 102 (FIG. 1) or 202 (FIG. 2).

A display controller 910 and a touch-screen controller 912 may be coupled to the CPU 904. A touchscreen display 914 external to the SoC 902 may be coupled to the display controller 910 and the touch-screen controller 912. The PCD 900 may further include a video decoder 916 coupled to the CPU 904. A video amplifier 918 may be coupled to the video decoder 916 and the touchscreen display 914. A video port 920 may be coupled to the video amplifier 918. A universal serial bus ("USB") controller 922 may also be coupled to CPU 904, and a USB port 924 may be coupled to the USB controller 922. A subscriber identity module ("SIM") card 926 may also be coupled to the CPU 904.

One or more memories may be coupled to the CPU 904. The one or more memories may include both volatile and non-volatile memories. Examples of volatile memories include static random access memory ("SRAM") 928 and dynamic random access memory ("DRAM") 930 and 931. Such memories may be external to the SoC 902, such as the DRAM 930, or internal to the SoC 902, such as the DRAM 931. A DRAM controller 932 coupled to the CPU 904 may control the writing of data to, and reading of data from, the DRAMs 930 and 931.

The DRAM controller 932 may be an example of any of the above-described memory controllers. Accordingly, the DRAM controller 932 may include the above-described rowhammer mitigation system 226 (FIG. 1) or 402 (FIG. 4). The DRAM controller 932 may be configured to perform or control the above-described method 300 (FIG. 3). The DRAM 930 or 931 may have a structure similar to the above-described DRAM device 208 (FIG. 2). The DRAM 930 or 931 may include the above-described rowhammer threshold logic 228 (FIG. 2) or 702 (FIG. 2). The DRAM 930 or 931 may be configured to perform or control the above-described method 600 (FIG. 6).

A stereo audio CODEC 934 may be coupled to the analog signal processor 908. Further, an audio amplifier 936 may be coupled to the stereo audio CODEC 934. First and second stereo speakers 938 and 940, respectively, may be coupled to the audio amplifier 936. In addition, a microphone amplifier 942 may be coupled to the stereo audio CODEC 934, and a microphone 944 may be coupled to the microphone amplifier 942. A frequency modulation ("FM") radio tuner 946 may be coupled to the stereo audio CODEC 934. An FM antenna 948 may be coupled to the FM radio tuner 946. Further, stereo headphones 950 may be coupled to the stereo audio CODEC 934. Other devices that may be coupled to the CPU 904 include one or more digital (e.g., CCD or CMOS) cameras 952.

The modem or RF transceiver 954 may be coupled to the analog signal processor 908 and the CPU 904. An RF switch 956 may be coupled to the RF transceiver 954 and an RF antenna 958. In addition, a keypad 960, a mono headset with a microphone 962, and a vibrator device 964 may be coupled to the analog signal processor 908.

The SoC 902 may have one or more internal or on-chip thermal sensors 970A and may be coupled to one or more external or off-chip thermal sensors 970B. An analog-to-digital converter controller 972 may convert voltage drops produced by the thermal sensors 970A and 970B to digital signals. A power supply 974 and a power management integrated circuit ("PMIC") 976 may supply power to the SoC 902.

Firmware or software may be stored in any of the above-described memories, such as the DRAM 930 or 931, SRAM 928, etc., or may be stored in a local memory directly accessible by the processor hardware on which the software or firmware executes. Execution of such firmware or software may control aspects of any of the above-described methods or configure aspects any of the above-described systems. Any such memory or other non-transitory storage medium having firmware or software stored therein in computer-readable form for execution by processor hardware may be an example of a "computer-readable medium," as the term is understood in the patent lexicon.

Implementation examples are described in the following numbered clauses.

1. A method, comprising:
   receiving, by a memory controller, an activation count threshold value from a dynamic random access memory (DRAM) device;
   detecting, by the memory controller, row activation commands directed to a bank of the DRAM device;
   counting, by the memory controller, a number of the row activation commands;
   comparing, by the memory controller, the number of row activation commands with the activation count threshold value; and
   sending, by the memory controller, a mitigative refresh command to the DRAM device based on a result of comparing the number of row activation commands with the activation count threshold value.

2. The method of clause 1, wherein receiving the activation count threshold value comprises polling the DRAM device at a polling interval.

3. The method of clause 2, further comprising receiving, by the memory controller, an indication of the polling interval from the DRAM device.

4. The method of clause 2 or 3, further comprising adjusting, by the memory controller, the polling interval based on one or more operating conditions of the memory controller.

5. The method of any of clauses 1-4, wherein receiving an activation count threshold value from the DRAM device comprises receiving a plurality of per-bank activation count threshold values, each corresponding to one of a plurality of banks of the DRAM device.

6. The method of any of clauses 1-5, further comprising:
   counting, by the DRAM device, a per-row number of the row activation commands directed to each row of the DRAM device;
   determining, by the DRAM device, a number of rows in each of a plurality of buckets, including, for each bucket, counting a number of rows having a per-row number of row activation commands directed thereto greater than or equal to a corresponding bucket activation count threshold of the bucket, wherein each bucket has a corresponding bucket activation count threshold different from all other buckets and a corresponding bucket threshold different from all other buckets;
   selecting, by the DRAM device, from among a subset of the buckets having non-zero numbers of rows therein, one of the buckets having a greatest bucket activation count threshold; and
   selecting, by the DRAM device, the bucket threshold of a selected one of the buckets.

7. The method of clause 6, wherein:
   each bucket has a corresponding activation count limit; and
   wherein each bucket in the subset of the buckets has a number of rows greater than or equal to the corresponding activation count limit.

8. The method of clause 6 or 7, further comprising:
   determining, by the DRAM in response to a mitigative refresh command received from the memory controller, a row having a greatest per-row number of row activation commands directed thereto; and
   refreshing, by the DRAM, the row determined to have the greatest per-row number of row activation commands directed thereto.

9. A system, comprising:
   interface logic in a memory controller, the interface logic configured to receive an activation count threshold value from a dynamic random access memory (DRAM) device;
   activation command detecting logic in the memory controller, the activation command detecting logic configured to detect row activation commands directed to a bank of the DRAM device;

activation command counting logic in the memory controller, the activation command counting logic configured to count a number of the row activation commands;

comparing logic in the memory controller, the comparing logic configured to compare the number of row activation commands with the activation count threshold value; and mitigative refresh logic in the memory controller, the mitigative refresh logic configured to send a mitigative refresh command to the DRAM device based on a result of comparing the number of row activation commands with the activation count threshold value.

10. The system of clause 9, wherein the interface logic is configured to poll the DRAM device for the per-bank-activation count threshold value at a polling interval.

11. The system of clause 10, wherein the interface logic is further configured to receive an indication of the polling interval from the DRAM device.

12. The system of clause 9 or 10, wherein the interface logic is further configured to adjust the polling interval based on one or more operating conditions of the memory controller.

13. The system of any of clauses 9-12, wherein the interface logic is configured to receive from the DRAM device a plurality of per-bank activation count threshold values, each corresponding to one of a plurality of banks of the DRAM device.

14. The system of any of clauses 9-13, further comprising:
per-row activation command counting logic in the DRAM device, the per-row activation command counting logic configured to count a per-row number of the row activation commands directed to each row of the DRAM device;
bucketizing logic in the DRAM device, the bucketizing logic configured to determine a number of rows in each of a plurality of buckets, including, for each bucket, to count a number of rows having a per-row number of row activation commands directed thereto greater than or equal to a corresponding bucket activation count threshold of the bucket, wherein each bucket has a corresponding bucket activation count threshold different from all other buckets and a corresponding bucket threshold different from all other buckets; and
bucket selecting logic in the DRAM device, the bucket selecting logic configured to select, from among a subset of the buckets having non-zero numbers of rows therein, one of the buckets having a greatest bucket activation count threshold, the bucket selecting logic further configured to select the bucket threshold of a selected one of the buckets.

15. The system of clause 14, wherein:
each bucket has a corresponding activation count limit; and
wherein each bucket in the subset of the buckets has a number of rows greater than or equal to the corresponding activation count limit.

16. The system of clause 14 or 15, further comprising:
buffer logic configured to provide an indication of a row having a greatest per-row number of row activation commands directed thereto; and
refresh command row selection logic configured to determine response to a mitigative refresh command received from the memory controller, the row having a greatest per-row number of row activation commands directed thereto, and to refresh the row determined to have the greatest per-row number of row activation commands directed thereto.

17. A system, comprising:
means for receiving an activation count threshold value from a dynamic random access memory (DRAM) device;
means for detecting row activation commands directed to a bank of the DRAM device;
means for counting a number of the row activation commands;
means for comparing the number of row activation commands with the activation count threshold value; and
means for sending a mitigative refresh command to the DRAM device based on a result of comparing the number of row activation commands with the activation count threshold value.

18. The system of clause 17, wherein the means for receiving the activation count threshold value comprises means for polling the DRAM device at a polling interval.

19. The system of clause 18, further comprising means for receiving an indication of the polling interval.

20. The system of clause 18 or 19, further comprising means for adjusting the polling interval.

21. The system of any of clause 17-20, wherein the means for receiving an activation count threshold value from the DRAM device comprises means for receiving a plurality of per-bank activation count threshold values, each corresponding to one of a plurality of banks of the DRAM device.

22. The system of any of clauses 17-21, further comprising:
means for counting a per-row number of the row activation commands directed to each row of the DRAM device;
means for determining a number of rows in each of a plurality of buckets, including, for each bucket, counting a number of rows having a per-row number of row activation commands directed thereto greater than or equal to a corresponding bucket activation count threshold of the bucket, wherein each bucket has a corresponding bucket activation count threshold different from all other buckets and a corresponding bucket threshold different from all other buckets;
means for selecting from among a subset of the buckets having non-zero numbers of rows therein, one of the buckets having a greatest bucket activation count threshold; and
means for selecting the bucket threshold corresponding to a selected one of the buckets.

23. The system of clause 22, wherein:
each bucket has a corresponding activation count limit; and
wherein each bucket in the subset of the buckets has a number of rows greater than or equal to the corresponding activation count limit.

24. The system of clause 22 or 23, further comprising:
means for determining, in response to a mitigative refresh command, a row having a greatest per-row number of row activation commands directed thereto; and
means for refreshing the row determined to have the greatest per-row number of row activation commands directed thereto.

25. A memory controller, comprising:
command generating logic configured to generate dynamic random access memory (DRAM) commands in response to memory transaction requests, the DRAM commands including row activation commands and refresh commands;

interface logic configured to receive an activation count threshold value from a DRAM device;

activation command detecting logic configured to detect row activation commands directed to a bank of the DRAM device;

activation command counting logic configured to count a number of the row activation commands;

comparing logic configured to compare the number of row activation commands with the activation count threshold value; and mitigative refresh logic configured to send a mitigative refresh command to the DRAM device based on a result of comparing the number of row activation commands with the activation count threshold value.

26. The memory controller of clause 25, wherein the interface logic is configured to poll the DRAM device for the per-bank-activation count threshold value at a polling interval.

27. The memory controller of clause 26, wherein the interface logic is further configured to receive an indication of the polling interval from the DRAM device.

28. The memory controller of clause 26 or 27, wherein the interface logic is further configured to adjust the polling interval based on one or more operating conditions of the memory controller.

29. The memory controller of any of clauses 25-28, wherein the interface logic is configured to receive from the DRAM device a plurality of per-bank activation count threshold values, each corresponding to one of a plurality of banks of the DRAM device.

30. A dynamic random access memory (DRAM) device, comprising:

at least one data storage array comprising a plurality of rows;

per-row activation command counting logic, the per-row activation command counting logic configured to count a per-row number of the row activation commands directed to each row of the DRAM device;

bucketizing logic, the bucketizing logic configured to determine a number of rows in each of a plurality of buckets, including, for each bucket, to count a number of rows having a per-row number of row activation commands directed thereto greater than or equal to a corresponding bucket activation count threshold of the bucket, wherein each bucket has a corresponding bucket activation count threshold different from all other buckets and a corresponding bucket threshold different from all other buckets; and bucket selecting logic, the bucket selecting logic configured to select, from among a subset of the buckets having non-zero numbers of rows therein, one of the buckets having a greatest bucket threshold, the bucket selecting logic further configured to select the bucket threshold of a selected one of the buckets and to provide an indication of a selected bucket threshold to a memory controller.

31. The DRAM device of clause 30, wherein:

each bucket has a corresponding activation count limit; and wherein each bucket in the subset of the buckets has a number of rows greater than or equal to the corresponding activation count limit.

32. The DRAM device of clause 30 or 31, further comprising:

buffer logic configured to provide an indication of a row having a greatest per-row number of row activation commands directed thereto; and refresh command row selection logic configured to determine response to a mitigative refresh command received from the memory controller, the row having a greatest per-row number of row activation commands directed thereto, and to refresh the row determined to have the greatest per-row number of row activation commands directed thereto.

Alternative embodiments will become apparent to one of ordinary skill in the art to which the invention pertains. Therefore, although selected aspects have been illustrated and described in detail, it will be understood that various substitutions and alterations may be made therein.

What is claimed is:

1. A method, comprising:

receiving, by a memory controller, an activation count threshold value from a dynamic random access memory (DRAM) device, wherein receiving the activation count threshold value comprises polling the DRAM device at a polling interval;

detecting, by the memory controller, row activation commands directed to a bank of the DRAM device;

counting, by the memory controller, a number of the row activation commands;

comparing, by the memory controller, the number of row activation commands with the activation count threshold value; and sending, by the memory controller, a mitigative refresh command to the DRAM device based on a result of comparing the number of row activation commands with the activation count threshold value.

2. The method of claim 1, further comprising receiving, by the memory controller, an indication of the polling interval from the DRAM device.

3. The method of claim 1, further comprising adjusting, by the memory controller, the polling interval based on one or more operating conditions of the memory controller.

4. The method of claim 1, wherein receiving the activation count threshold value from the DRAM device comprises receiving a plurality of per-bank activation count threshold values, each corresponding to one of a plurality of banks of the DRAM device.

5. The method of claim 1, further comprising:

counting, by the DRAM device, a per-row number of the row activation commands directed to each row of the DRAM device;

determining, by the DRAM device, a number of rows in each of a plurality of buckets, including, for each bucket, counting a number of rows having a per-row number of row activation commands directed thereto greater than or equal to a corresponding bucket activation count threshold of the bucket, wherein each bucket has a corresponding bucket activation count threshold different from all other buckets and a corresponding bucket threshold different from all other buckets;

selecting, by the DRAM device, from among a subset of the buckets having non-zero numbers of rows therein, one of the buckets having a greatest bucket activation count threshold; and selecting, by the DRAM device, the bucket threshold of a selected one of the buckets.

6. The method of claim 5, wherein:

each bucket has a corresponding activation count limit; and wherein each bucket in the subset of the buckets has a number of rows greater than or equal to the corresponding activation count limit.

7. The method of claim 5, further comprising:
determining, by the DRAM in response to a mitigative refresh command received from the memory controller, a row having a greatest per-row number of row activation commands directed thereto; and
refreshing, by the DRAM, the row determined to have the greatest per-row number of row activation commands directed thereto.

8. A system, comprising:
interface logic in a memory controller, the interface logic configured to receive an activation count threshold value from a dynamic random access memory (DRAM) device by polling the DRAM device at a polling interval;
activation command detecting logic in the memory controller, the activation command detecting logic configured to detect row activation commands directed to a bank of the DRAM device;
activation command counting logic in the memory controller, the activation command counting logic configured to count a number of the row activation commands;
comparing logic in the memory controller, the comparing logic configured to compare the number of row activation commands with the activation count threshold value; and
mitigative refresh logic in the memory controller, the mitigative refresh logic configured to send a mitigative refresh command to the DRAM device based on a result of comparing the number of row activation commands with the activation count threshold value.

9. The system of claim 8, wherein the interface logic is further configured to receive an indication of the polling interval from the DRAM device.

10. The system of claim 8, wherein the interface logic is further configured to adjust the polling interval based on one or more operating conditions of the memory controller.

11. The system of claim 8, wherein the interface logic is configured to receive from the DRAM device a plurality of per-bank activation count threshold values, each corresponding to one of a plurality of banks of the DRAM device.

12. The system of claim 8, further comprising:
per-row activation command counting logic in the DRAM device, the per-row activation command counting logic configured to count a per-row number of the row activation commands directed to each row of the DRAM device;
bucketizing logic in the DRAM device, the bucketizing logic configured to determine a number of rows in each of a plurality of buckets, including, for each bucket, to count a number of rows having a per-row number of row activation commands directed thereto greater than or equal to a corresponding bucket activation count threshold of the bucket, wherein each bucket has a corresponding bucket activation count threshold different from all other buckets and a corresponding bucket threshold different from all other buckets; and
bucket selecting logic in the DRAM device, the bucket selecting logic configured to select, from among a subset of the buckets having non-zero numbers of rows therein, one of the buckets having a greatest bucket activation count threshold, the bucket selecting logic further configured to select the bucket threshold of a selected one of the buckets.

13. The system of claim 12, wherein:
each bucket has a corresponding activation count limit; and
wherein each bucket in the subset of the buckets has a number of rows greater than or equal to the corresponding activation count limit.

14. The system of claim 12, further comprising:
buffer logic configured to provide an indication of a row having a greatest per-row number of row activation commands directed thereto; and
refresh command row selection logic configured to determine response to a mitigative refresh command received from the memory controller, the row having a greatest per-row number of row activation commands directed thereto, and to refresh the row determined to have the greatest per-row number of row activation commands directed thereto.

15. A system, comprising:
means for receiving an activation count threshold value from a dynamic random access memory (DRAM) device, wherein the means for receiving the activation count threshold value comprises means for polling the DRAM device at a polling interval;
means for detecting row activation commands directed to a bank of the DRAM device;
means for counting a number of the row activation commands;
means for comparing the number of row activation commands with the activation count threshold value; and
means for sending a mitigative refresh command to the DRAM device based on a result of comparing the number of row activation commands with the activation count threshold value.

16. The system of claim 15, further comprising means for receiving an indication of the polling interval.

17. The system of claim 15, further comprising means for adjusting the polling interval.

18. The system of claim 15, wherein the means for receiving an activation count threshold value from the DRAM device comprises means for receiving a plurality of per-bank activation count threshold values, each corresponding to one of a plurality of banks of the DRAM device.

19. The system of claim 15, further comprising:
means for counting a per-row number of the row activation commands directed to each row of the DRAM device;
means for determining a number of rows in each of a plurality of buckets, including, for each bucket, counting a number of rows having a per-row number of row activation commands directed thereto greater than or equal to a corresponding bucket activation count threshold of the bucket, wherein each bucket has a corresponding bucket activation count threshold different from all other buckets and a corresponding bucket threshold different from all other buckets;
means for selecting from among a subset of the buckets having non-zero numbers of rows therein, one of the buckets having a greatest bucket activation count threshold; and
means for selecting the bucket threshold corresponding to a selected one of the buckets.

20. The system of claim 19, wherein:
each bucket has a corresponding activation count limit; and
wherein each bucket in the subset of the buckets has a number of rows greater than or equal to the corresponding activation count limit.

21. The system of claim 19, further comprising:
means for determining, in response to a mitigative refresh command, a row having a greatest per-row number of row activation commands directed thereto; and
means for refreshing the row determined to have the greatest per-row number of row activation commands directed thereto.

22. A memory controller, comprising:
command generating logic configured to generate dynamic random access memory (DRAM) commands in response to memory transaction requests, the DRAM commands including row activation commands and refresh commands;
interface logic configured to receive an activation count threshold value from a DRAM device by polling the DRAM device at a polling interval;
activation command detecting logic configured to detect row activation commands directed to a bank of the DRAM device;
activation command counting logic configured to count a number of the row activation commands;
comparing logic configured to compare the number of row activation commands with the activation count threshold value; and
mitigative refresh logic configured to send a mitigative refresh command to the DRAM device based on a result of comparing the number of row activation commands with the activation count threshold value.

23. The memory controller of claim 22, wherein the interface logic is further configured to receive an indication of the polling interval from the DRAM device.

24. The memory controller of claim 22, wherein the interface logic is further configured to adjust the polling interval based on one or more operating conditions of the memory controller.

25. The memory controller of claim 22, wherein the interface logic is configured to receive from the DRAM device a plurality of per-bank activation count threshold values, each corresponding to one of a plurality of banks of the DRAM device.

26. A dynamic random access memory (DRAM) device, comprising:
at least one data storage array comprising a plurality of rows;
per-row activation command counting logic, the per-row activation command counting logic configured to count a per-row number of the row activation commands directed to each row of the DRAM device;
bucketizing logic, the bucketizing logic configured to determine a number of rows in each of a plurality of buckets, including, for each bucket, to count a number of rows having a per-row number of row activation commands directed thereto greater than or equal to a corresponding bucket activation count threshold of the bucket, wherein each bucket has a corresponding bucket activation count threshold different from all other buckets and a corresponding bucket threshold different from all other buckets; and
bucket selecting logic, the bucket selecting logic configured to select, from among a subset of the buckets having non-zero numbers of rows therein, one of the buckets having a greatest bucket threshold, the bucket selecting logic further configured to select the bucket threshold of a selected one of the buckets and to provide an indication of a selected bucket threshold to a memory controller.

27. The DRAM device of claim 26, wherein:
each bucket has a corresponding activation count limit; and
wherein each bucket in the subset of the buckets has a number of rows greater than or equal to the corresponding activation count limit.

28. The DRAM device of claim 26, further comprising:
buffer logic configured to provide an indication of a row having a greatest per-row number of row activation commands directed thereto; and
refresh command row selection logic configured to determine response to a mitigative refresh command received from the memory controller, the row having a greatest per-row number of row activation commands directed thereto, and to refresh the row determined to have the greatest per-row number of row activation commands directed thereto.

* * * * *